United States Patent
Lee (10) Patent No.: US 9,443,596 B2
(45) Date of Patent: Sep. 13, 2016

(54) NON-VOLATILE MEMORY DEVICE AND METHOD OF PROGRAMMING THE SAME

(71) Applicant: Chang-Hyun Lee, Suwon-si (KR)

(72) Inventor: Chang-Hyun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 316 days.

(21) Appl. No.: 14/192,544

(22) Filed: Feb. 27, 2014

(65) Prior Publication Data

US 2014/0269080 A1    Sep. 18, 2014

(30) Foreign Application Priority Data

Mar. 15, 2013 (KR) ........................ 10-2013-0027838

(51) Int. Cl.
G11C 11/34 (2006.01)
G11C 16/10 (2006.01)
G11C 16/04 (2006.01)
G11C 16/30 (2006.01)
G11C 16/34 (2006.01)

(52) U.S. Cl.
CPC ........... *G11C 16/10* (2013.01); *G11C 16/0483* (2013.01); *G11C 16/30* (2013.01); *G11C 16/3427* (2013.01)

(58) Field of Classification Search
USPC .................................................. 365/185.17
See application file for complete search history.

(56) References Cited

U.S. PATENT DOCUMENTS

| | | | |
|---|---|---|---|
| 6,259,624 B1 * | 7/2001 | Nobukata | G11C 11/5621 365/185.02 |
| 6,717,861 B2 | 4/2004 | Jeong et al. | |
| 6,930,921 B2 * | 8/2005 | Matsunaga | G11C 16/0483 365/185.17 |
| 7,596,019 B2 * | 9/2009 | Joo | G11C 16/3418 365/185.02 |
| 7,773,414 B2 | 8/2010 | Hemink | |
| 8,174,891 B2 | 5/2012 | Hosono | |
| 2008/0084747 A1 | 4/2008 | Hemink et al. | |
| 2008/0084748 A1 | 4/2008 | Hemink et al. | |
| 2009/0230451 A1 * | 9/2009 | Lee | H01L 27/11521 257/315 |
| 2009/0257280 A1 * | 10/2009 | Oh | G11C 16/10 365/185.19 |
| 2010/0054036 A1 * | 3/2010 | Lee | G11C 16/0483 365/185.03 |
| 2010/0124120 A1 | 5/2010 | Park et al. | |
| 2013/0258771 A1 * | 10/2013 | Lee | G11C 16/24 365/185.02 |
| 2014/0269080 A1 * | 9/2014 | Lee | G11C 16/10 365/185.17 |

FOREIGN PATENT DOCUMENTS

| | | |
|---|---|---|
| JP | 11-087662 | 3/1999 |
| JP | 2003-288792 | 10/2003 |
| KR | 10-1034917 B1 | 5/2011 |
| KR | 10-2011-119977 A | 11/2011 |

* cited by examiner

*Primary Examiner* — Hoai V Ho
*Assistant Examiner* — Pablo Huerta
(74) *Attorney, Agent, or Firm* — Myers Bigel & Sibley, P.A.

(57) ABSTRACT

A non-volatile memory device includes a memory cell array and a voltage generator. The memory cell array has a plurality of cell strings in which a plurality of memory cells are connected with each other in series between a string select transistor and a ground select transistor. The voltage generator generates a program voltage, a first pass voltage, and a second pass voltage. A first boost channel voltage applied when programming an outermost memory cell from among the memory cells of each of non-selected cell strings of the cell strings is lower than a second boost channel voltage applied when programming one of remaining memory cells except for the outermost memory cell. The non-volatile memory device prevents programming disturb caused by hot carrier injection.

18 Claims, 11 Drawing Sheets

NON-VOLATILE MEMORY DEVICE AND METHOD OF PROGRAMMING THE SAME

CROSS-REFERENCE TO RELATED APPLICATION

This application claims priority under 35 USC §119 to Korean Patent Application No. 10-2013-0027838 filed on Mar. 15, 2013 in the Korean Intellectual Property Office (KIPO), the entire disclosure of which is incorporated herein by reference.

FIELD

Example embodiments relate to non-volatile memory devices. More particularly, example embodiments relate to NAND flash memory devices capable of reducing degradation of program characteristics due to hot carrier injection (HCI).

BACKGROUND

Semiconductor memory devices may be classified into volatile memory devices and non-volatile memory devices. In the case of the volatile memory devices, all stored data may be lost if the power supply is shut off.

Dynamic random access memory devices (DRAM devices) and static RAM devices (SRAM devices) are representative volatile memory devices.

In the case of the non-volatile memory devices, even if the power supply is shut off, stored data are retained. Due to such a characteristic, the non-volatile memory devices may be used as storage media installed in potable appliances and/or electronic appliances. NAND flash memory devices among the non-volatile memory devices have been extensively used as storage devices of electronic appliances, such as smart phones, digital cameras, and solid state drives (SSDs).

As semiconductor industries have been highly developed, various characteristics of non-volatile memory devices may be improved. For example, data stored in non-volatile memory devices may be lost due to several external causes and/or several internal causes. The data loss may be one cause of significantly serious errors in non-volatile memory devices. Recently, many studies and research have been carried out to improve several characteristics of non-volatile memory devices according to the demand of highly-advanced semiconductor industries.

SUMMARY

Some example embodiments provide a non-volatile memory device capable of preventing programming disturb caused by hot carrier injection by reducing a lateral electric field in a program operation of the outermost word line, and a method of programming the same.

Some example embodiments provide a non-volatile memory device capable of improving a program characteristic of the outermost word line based on the number of partial programs, and a method of programming the same.

According to example embodiments, a non-volatile memory device includes a memory cell array and a voltage generator. The memory cell array has a plurality of cell strings in which a plurality of memory cells are connected with each other in series between a string select transistor and a ground select transistor. The voltage generator generates a program voltage, a first pass voltage, and a second pass voltage. A first boost channel voltage applied when programming an outermost memory cell from among the memory cells of each of non-selected cell strings of the plurality of cell strings is lower than a second boost channel voltage applied when programming one of remaining memory cells except for the outermost memory cell.

In example embodiments, the first boost channel voltage may be formed by combining the program voltage applied to a word line of the outermost memory cell with first pass voltages applied to word lines of the remaining memory cells, the second boost channel voltage may be formed by the program voltage applied to a word line of the one remaining memory cell except for the outermost memory cell and the second pass voltages applied to each word line of each of the memory cells except for the one remaining memory cell, and a level of the first pass voltage may be lower than a level of the second pass voltage.

In example embodiments, the non-selected cell strings may be driven according to a self-boost scheme, or a local boost scheme.

In example embodiments, the first boost channel voltage may be formed through a self-boost scheme and the second boost channel voltage may be formed through a local boost scheme.

In example embodiments, a number of word lines combined to form a first boost channel, which forms the first boost channel voltage, to receive a pass voltage may be larger than a number of word lines combined to form a second boost channel, which forms the second boost channel voltage, to receive a pass voltage.

The pass voltage applied to the word lines combined to the first boost channel may be the first pass voltage, the pass voltage applied to the word lines combined to the second boost channel may be one of the first pass voltage and the second pass voltage, and a level of the first pass voltage may be lower than a level of the second pass voltage.

In example embodiments, a condition to set the first boost channel voltage lower than the second boost channel voltage may be that a number of programs is equal to or greater than a critical number causing programming disturb due to accumulated hot carrier injection into the outermost memory cell.

In example embodiments, a first dummy memory cell may be interposed between the ground select transistor and the memory cells, and a second dummy memory cell may be interposed between the string select transistor and the memory cells.

In a method of programming a non-volatile memory device including a memory cell array having a plurality of cell strings in which a plurality of memory cells are connected with each other in series between a string select transistor and a ground select transistor, and a voltage generator to generate a program voltage, a first pass voltage, and a second pass voltage, a first boost channel voltage applied when programming an outermost memory cell from among the memory cells of each of non-selected cell strings of the cell strings is set lower than a second boost channel voltage applied when programming one of remaining memory cells except for the outermost memory cell.

In example embodiments, the first boost channel voltage may be formed by combining the program voltage applied to a word line of the outermost memory cell with first pass voltages applied to word lines of the remaining memory cells, the second boost channel voltage may be formed by the program voltage applied to a word line of the one remaining memory cell except for the outermost memory cell and the second pass voltage applied to each word line of each of the memory cells except for the one remaining memory cell, and a level of the first pass voltage may be lower than a level of the second pass voltage.

In example embodiments, the non-selected cell strings may be driven according to a self-boost scheme, or a local boost scheme.

In example embodiments, the first boost channel voltage may be formed through a self-boost scheme, and the second boost channel voltage may be formed through a local boost scheme.

In example embodiments, a number of word lines combined to a first boost channel, which forms the first boost channel voltage, to receive a pass voltage may be larger than a number of word lines combined to a second boost channel, which forms the second boost channel voltage, to receive a pass voltage.

The pass voltage applied to the word lines combined to the first boost channel may be the first pass voltage, the pass voltage applied to the word lines combined to the second boost channel may be one of the first pass voltage and the second pass voltage, and a level of the first pass voltage may be lower than a level of the second pass voltage.

In example embodiments, a condition to set the first boost channel voltage lower than the second boost channel voltage may be that a number of programs is equal to or greater than a critical number causing programming disturb due to accumulated hot carrier injection into the outermost memory cell.

BRIEF DESCRIPTION OF THE DRAWINGS

Example embodiments will be more clearly understood from the following detailed description taken in conjunction with the accompanying drawings. FIGS. 1 to 12 represent non-limiting, example embodiments as described herein.

DETAILED DESCRIPTION OF THE EMBODIMENTS

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1:
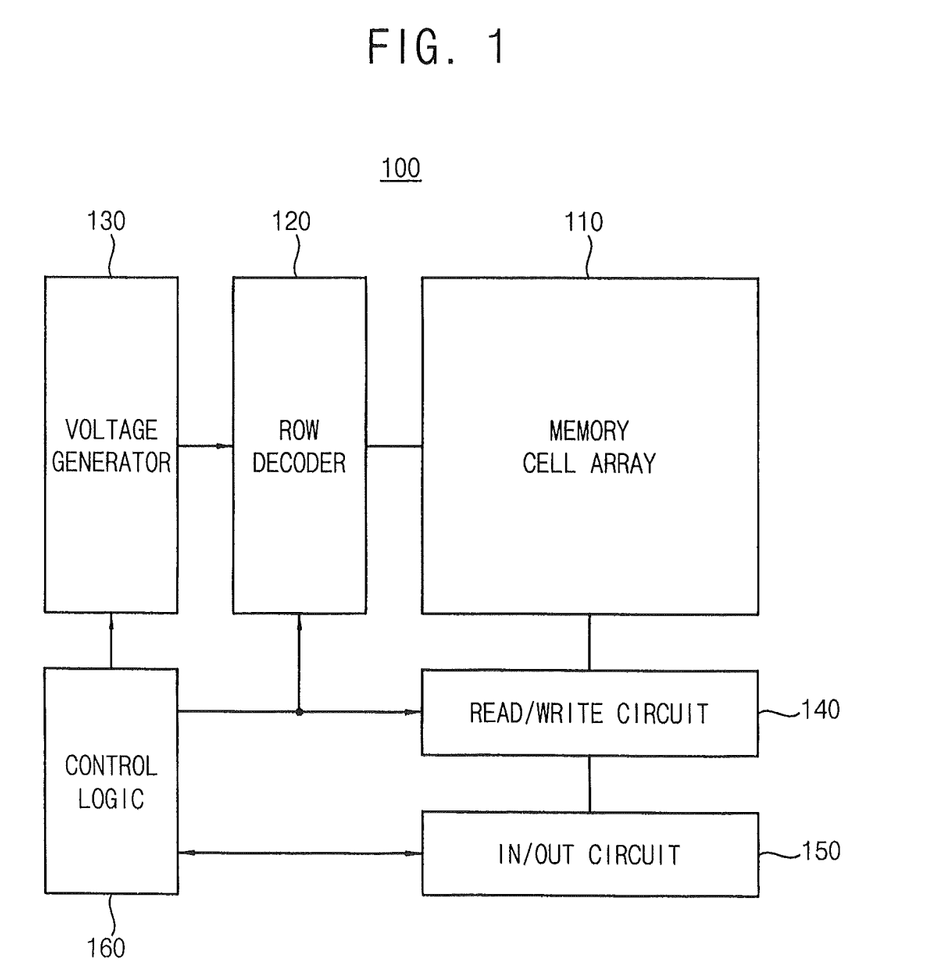
FIG. 1 is a block diagram illustrating a non-volatile memory device according to an example embodiment of the present inventive concept.

FIG. 1 is a block diagram illustrating a non-volatile memory device 100 according to an example embodiment of the present inventive concept.

Referring to FIG. 1, the non-volatile memory device 100 includes a memory cell array 110, a row decoder 120, a voltage generator 130, a read/write circuit 140, an in/out circuit 150, and a control logic 160.

The memory cell array 110 includes a plurality of memory cells. Each memory cell stores data, which are received therein from the read/write circuit 140. For example, each memory cell may store one bit. Each memory cell may store at least two multi-bits. Each memory cell is connected to the row decoder 120 through a word line WL.

The row decoder 120 is connected to the memory cell 110 through the word line WL. The row decoder 120 is controlled by the control logic 160 to select and drive rows of the memory cell array 110. For example, the row decoder 120 may be configured to drive the rows of the memory cell array 110 with a negative voltage as well as a high positive voltage.

The voltage generator 130 is controlled by the control logic 160 and configured to generate voltages to be supplied to the memory cell array 110. For example, the voltage generator 130 generates a program voltage VPGM, a read voltage VREAD, a first pass voltage VPASS1, a second pass voltage VPASS2, and a local voltage VLOCAL.

The read/write circuit 140 is controlled by the control logic 160, and configured to drive the bit lines BL of the memory cell array 110 with a bit line program inhibit voltage or a bit line program voltage according to the state of data to be programmed. For example, the bit line program voltage may be a power supply voltage VCC. For example, the bit line program voltage may be a ground voltage 0V. In addition, the read/write circuit 140 is configured to read data from memory cells selected from the memory cell array 110 in a read operation.

The in/out circuit 150 is controlled by the control logic 160, and configured to act as a data interface between the read/write circuit 140 and an external device.

The control logic 160 is configured to control the overall operation of the non-volatile memory device 100. The control logic 160 according to the example embodiment of the present inventive concept counts the number of partial programs (NOP). If the NOP is equal to or greater than the critical number A causing programming disturbance due to the accumulated hot carrier injection, then the row decoder 120 and the voltage generator 130 are controlled so that the first boost channel voltage is lower than the second boost channel voltage.

In the non-volatile memory cell according to the example embodiment of the present inventive concept, the first boost channel voltage when programming the outermost memory cell of each non-selected cell string among a plurality of cell strings is maintained lower than the second boost channel voltage when programming one of the remaining memory cells other than the outermost memory cell, thereby reducing or preventing the programming disturbance in the outermost memory cell of the non-selected cell string.

Figure 2:
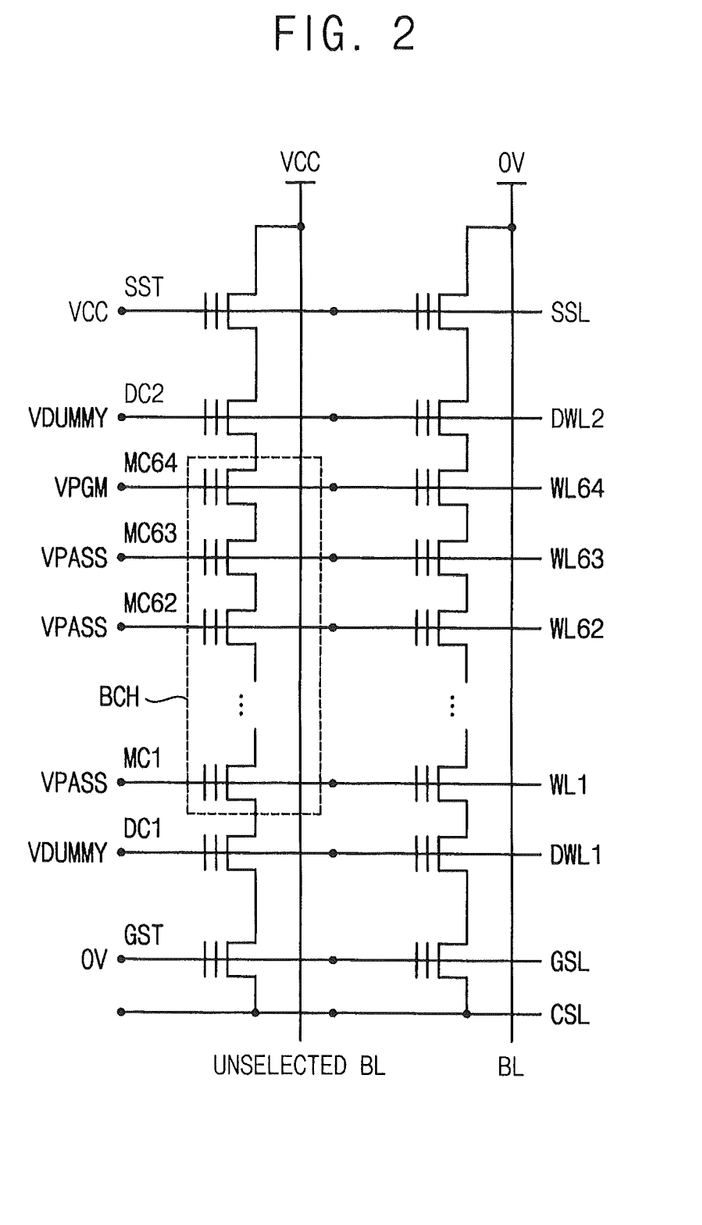
FIG. 2 is a circuit diagram illustrating the structure of a cell string in the memory cell array of FIG. 1.

FIG. 2 is a circuit diagram illustrating the structure of a cell string in the memory cell array 110 of FIG. 1.

The memory cell array 110 may include a plurality of memory blocks. FIG. 2 illustrates a two-cell string structure of one among the memory blocks. The two cell strings include a selected cell string, to which the bit line program voltage 0V is applied, and a non-selected cell string to which the bit line program inhibit voltage VCC is applied. In brief, it is assumed that the memory block includes a flash memory and has 64 word lines WL and two dummy word lines WL.

Referring to FIG. 2, a plurality of memory cells are connected in series between a string select transistor SST and a ground select transistor GST. For example, it is assumed that the memory cells include two dummy memory cells (DC) and 64 memory cells (MC).

For example, a first dummy memory cell DC1 is interposed between the ground select transistor GST and a first memory cell MC1. A second dummy memory cell DC2 is interposed between the string select transistor SST and a sixty-fourth memory cell MC64. The string select transistor SST, the ground select transistor GST, the dummy memory cells DC1 and DC2, and the memory cells MC1 to MC64, which are interposed between the string select transistor SST and the ground select transistor GST, may constitute a string. The first and second dummy cells DC1 and DC2 are connected with first and second word lines DWL1 and DWL2, respectively. A first memory cell MC1 to the sixty-fourth memory cell MC64 are connected with a first word line WL1 to a sixty-fourth word line WL64.

A channel boosting scheme is used in such a manner that a selected memory cell (selected cell string) is programmed, and a non-selected memory cell (non-selected cell string) located on the same line as that of the selected memory cell is inhibited from being programmed. The channel boosting scheme includes a self boosting scheme and a local boosting scheme.

According to the self boosting scheme, both of a gate and a drain of the string select transistor (SST) of the non-selected cell string is supplied with the power supply voltage VCC, and a gate of the ground select transistor GST is supplied with the ground voltage 0V, thereby boosting a channel voltage. Accordingly, the potential difference between a channel and a floating gate of the memory cell of the non-selected bit line is made to be less than a potential difference to cause F-N tunneling. A dotted region of FIG. 2 represents a boost channel BCH according to the self boosting.

The local boosting scheme is similar to the self-boosting scheme. However, according to the local boosting scheme, the local voltage VLOCAL is applied to a word line of a memory cell located at one side or at both sides of a memory cell selected from memory cells of a cell string connected with a non-selected bit line to turn off the word line, thereby electrically dividing a channel of a cell string connected with the non-selected bit line into at least two local channels, that is, a channel including the selected memory cell and the other channel, so that the channel of the cell string connected with the non-selected bit line is maintained in a floating state. Therefore, a channel voltage of each local channel is boosted. According to the local boosting scheme, the boosting of the channel voltage of the program inhibit cell can be improved when comparing with the self-boosting scheme.

In addition, the potential difference between a boost channel voltage VCH and a program voltage VPGM is made to be less than a potential difference to cause F-N tunneling.

However, if the boost channel voltage VCH is increased, the difference in the lateral electric field between the boost channel voltage VCH and the channel voltage of the string select transistor SST is increased. If a strong electric field is formed, hot carriers (hot electrons) are generated. The hot carriers are accelerated toward the drain of the outermost memory cell MC64, and a plurality of electron-hole pairs (EHPs) are produced due to an avalanche phenomenon. In this case, because a plurality of electrons is introduced into the boost channel, the voltage of the boosted channel is lowered. Therefore, the boosting efficiency is reduced, so that the programming disturbance is caused in the outermost memory cell MC64, which is to be inhibited from being programmed. In the worst case, the outermost memory cell MC64 may be programmed. In other words, the programming disturbance may be caused by the hot carriers.

In the non-volatile memory cell according to the example embodiment of the present inventive concept, the first boost channel voltage when programming the outermost memory cell of each non-selected cell string among a plurality of cell strings is maintained lower than the second boost channel voltage when programming one of the remaining memory cells other than the outermost memory cell, thereby reducing or preventing the programming disturbance of the outermost memory cell of the non-selected cell string. Hereinafter, several embodiments to maintain the first boost channel voltage lower than the second boost channel voltage will be described.

Embodiment 1

Figure 3:
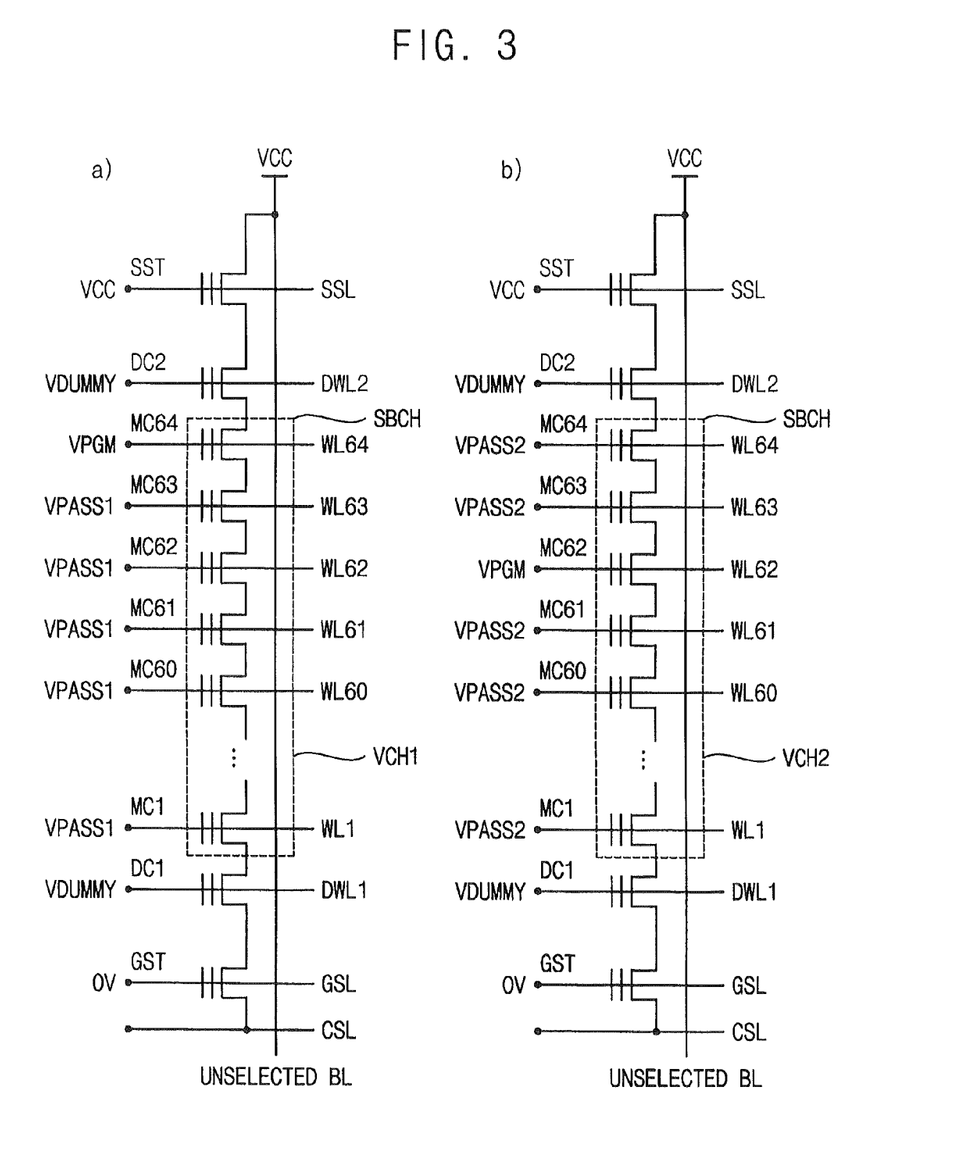
FIG. 3 illustrates a voltage application state according to the selection of a word line of a non-selected cell string according to a first example embodiment in which circuit a) illustrates a circuit diagram when the outermost word line is selected, and circuit b) illustrates a circuit diagram when an internal word line is selected.

FIG. 3 illustrates a voltage application state according to the selection of a word line of a non-selected cell string according to a first example embodiment in which circuit a) illustrates a circuit diagram when the outermost word line is selected, and circuit b) illustrates a circuit diagram when an internal word line is selected. In this case, it is assumed that the self-boosting scheme is applied. Dotted regions of FIG. 3 represent self-boost channels SBCH according to the self-boosting scheme.

As illustrated in circuit a) of FIG. 3, in the non-volatile memory device according to the example embodiment of the present inventive concept, when the outermost word line WL64 or WL1 is selected, the word lines WL2 to WL63, which are not selected, receive the first pass voltage VPASS1.

As illustrated in circuit b) of FIG. 3, when the word line WL62 is selected from among the other word lines WL1 to WL63 instead of the outermost word line WL64 or WL1, the second pass voltage VPASS2 having a level higher than that of the first pass voltage VPASS1 is applied.

When the outermost word line WL64 or WL1 is selected, because the first pass voltage VPASS1 having a level lower than that of the second pass voltage VPASS2 is applied to a channel, the first boost channel voltage VCH1 from the first pass voltage VPASS1 is formed at a level lower than that of the second boost channel voltage VCH2 from the second pass voltage VPASS2.

Accordingly, the lateral electric field formed between the first boost channel voltage VCH1 and the channel voltage of the string select transistor SST is reduced, thereby reducing or preventing hot carriers. Therefore, the programming disturbance can be reduced or prevented in the memory cell MC64 that is inhibited from being programmed.

In this case, on the assumption that the critical voltage to cause the F-N tunneling from the potential difference between the first boost channel voltage VCH and the program voltage VPGM is Vt, the first pass voltage VPASS1 may be set so that the first boost channel voltage VCH satisfies the condition of the Vt<VCH1<VCH2.

Embodiment 2

Figure 4:
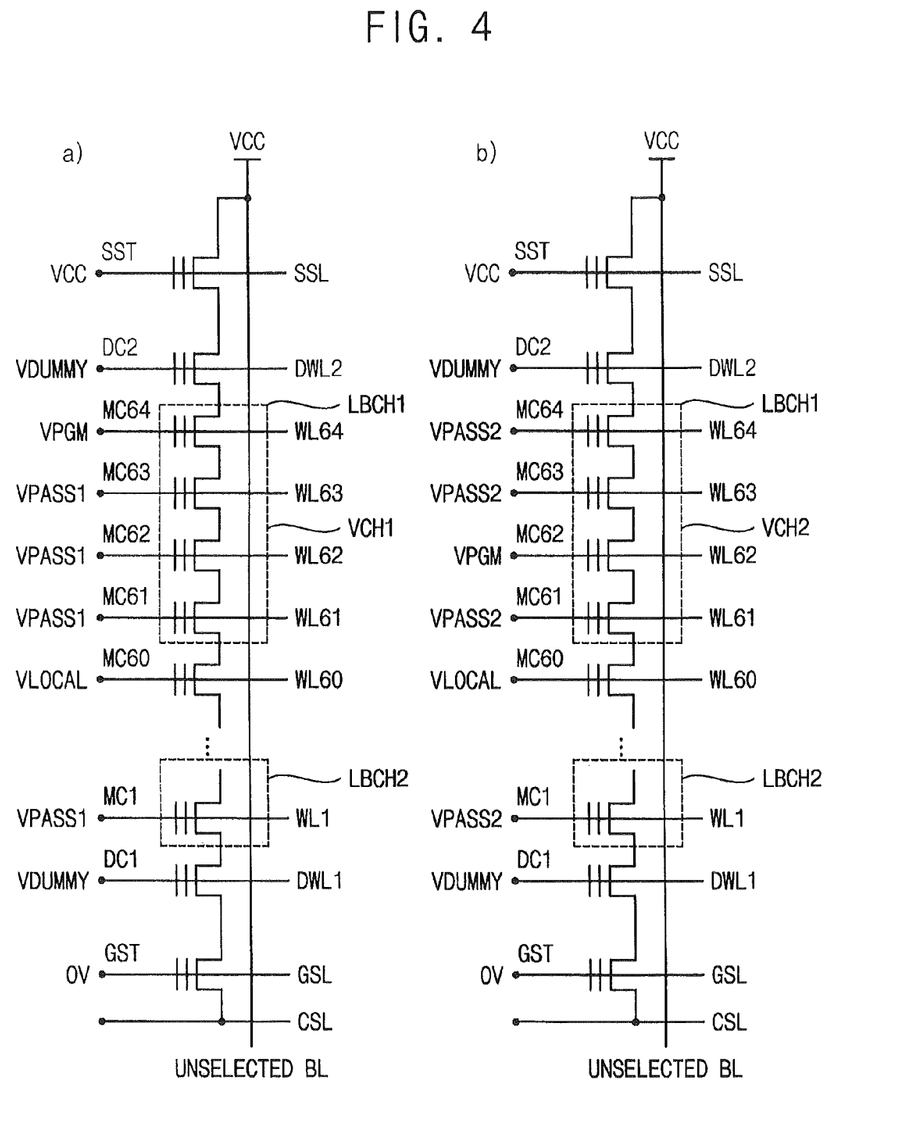
FIG. 4 illustrates a voltage application state according to the selection of a word line of a non-selected cell string according to a second example embodiment in which circuit a) illustrates a circuit diagram when the outermost word line is selected, and circuit b) illustrates a circuit diagram when an internal word line is selected.

FIG. 4 illustrates a voltage application state according to the selection of a word line of a non-selected cell string according to a second example embodiment in which circuit a) illustrates a circuit diagram when the outermost word line is selected, and circuit b) illustrates a circuit diagram when an internal word line is selected. In this case, it is assumed that the local boosting scheme is applied. Dotted regions of FIG. 4 represent local boost channels LBCH1 and LBCH2 according to the local boosting scheme.

Differently from that of the first embodiment, the local boosting scheme is applied to the second example embodiment illustrated in FIG. 4. In other words, the local voltage VLOCAL is applied to the word line WL60 to form the local boost channel LBCH1 including the word lines WL64 to WL61 and the local boost channel LBCH2 including the word lines WL59 to WL1.

As illustrated in circuit a) of FIG. 4, in the non-volatile memory device according to the example embodiment of the present inventive concept, when the outermost word line WL64 is selected, the word lines WL61 to WL63, which are not selected, receive the first pass voltage VPASS1.

As illustrated in circuit b) of FIG. 4, when the word line WL62 among the other word lines WL61 to WL63 is selected instead of the outermost word line WL64, the second pass voltage VPASS2 having a level higher than that of the first pass voltage VPASS1 is applied to the word lines WL61, WL63, and WL64.

Therefore, because the first boost channel voltage VCH1 across the local boost channel LBCH1 is made lower than the second boost channel voltage VCH2, the occurrence of the hot carriers can be reduced. Therefore, the programming disturbance can be reduced or prevented in the memory cell MC64 that is inhibited from being programmed.

In this case, on the assumption that the critical voltage to cause the F-N tunneling from the potential difference between the first boost channel voltage VCH and the program voltage VPGM is Vt, the first pass voltage VPASS1 may be set so that the first boost channel voltage VCH satisfies the condition of the Vt<VCH1<VCH2.

Embodiment 3

Figure 5:
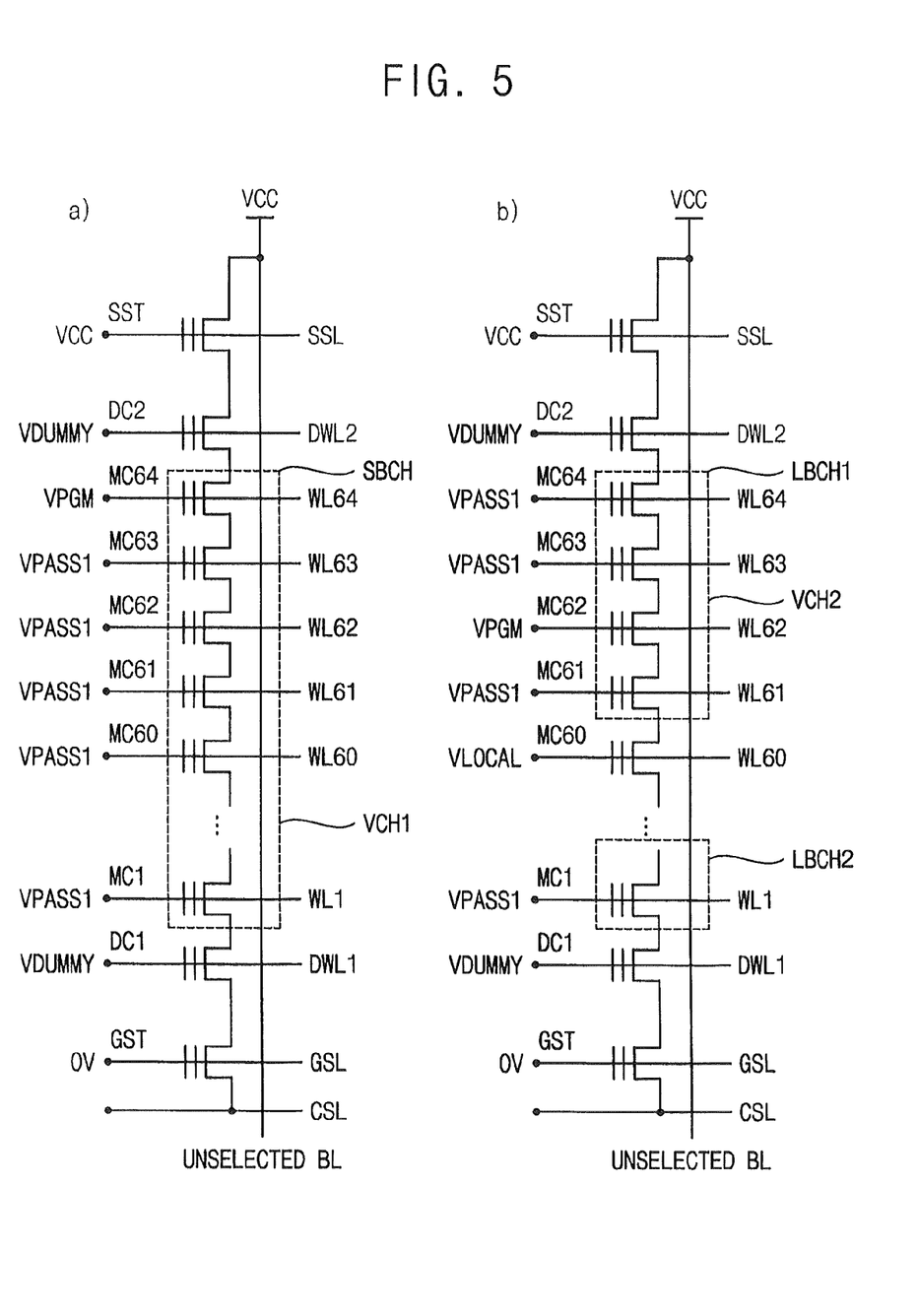
FIG. 5 illustrates a voltage application state according to the selection of a word line of a non-selected cell string according to a third example embodiment in which circuit a) illustrates a circuit diagram when the outermost word line is selected, and circuit b) illustrates a circuit diagram when an internal word line is selected.

FIG. 5 illustrates a voltage application state according to the selection of a word line of a non-selected cell string according to a third example embodiment in which circuit a) illustrates a circuit diagram when the outermost word line is selected, and circuit b) illustrates a circuit diagram when an internal word line is selected. In this case, it is assumed that the self-boosting scheme is applied when the outermost word line is selected, and the local boosting scheme is applied when the internal word line is selected.

Differently from the first and second example embodiments described above, both of the self-boosting scheme and the local boosting scheme are applied to the third example embodiment.

As illustrated in circuit a) of FIG. 5, in the non-volatile memory device according to the example embodiment of the present inventive concept, when the outermost word line WL64 is selected, the self-boosting scheme is applied, so that the word lines WL61 to WL63, which are not selected, receive the first pass voltage VPASS1.

As illustrated in circuit b) of FIG. 5, when the word line WL62 among the other word lines WL61 to WL63 is selected instead of the outermost word line WL64, the local boosting scheme is applied, so that the local voltage VLOCAL is applied to the word line WL60 to form the local boost channel LBCH1 including the word lines WL64 to WL61 and the local boost channel LBCH2 including the word lines WL59 to WL1. In addition, the first pass voltage VPASS1 is applied to the word lines WL61, WL63, and WL64 included in the local boost channel LBCH1.

Therefore, the program voltage VPGM is combined with 63 first pass voltages VPASS1 in parallel in the self-boost channel SBCH, and the program voltage VPGM is combined with three first pass voltages VPASS1 in parallel in the local boost channel LBCH1. Accordingly, the number of the word lines WL1 to WL63, which are not selected, combined to the self-boost channel SBCH is larger than the number of the word lines WL61, WL63, and WL64, which are not selected, combined to the local boost channel LBCH1.

Accordingly, even if the same pass voltage VPASS1 is applied to the word lines that are not selected, because the first boost channel voltage VCH1 is formed lower than the second boost channel voltage VCH2, the occurrence of the hot carriers can be reduced. Therefore, the programming disturbance can be reduced or prevented in the memory cell MC64 that is inhibited from being programmed.

In this case, when the internal word line is selected, the pass voltage applied to the word lines, which are not selected, may be the second pass voltage VPASS2 having a level higher than that of the first pass voltage VPASS1.

Embodiment 4

Figure 6:
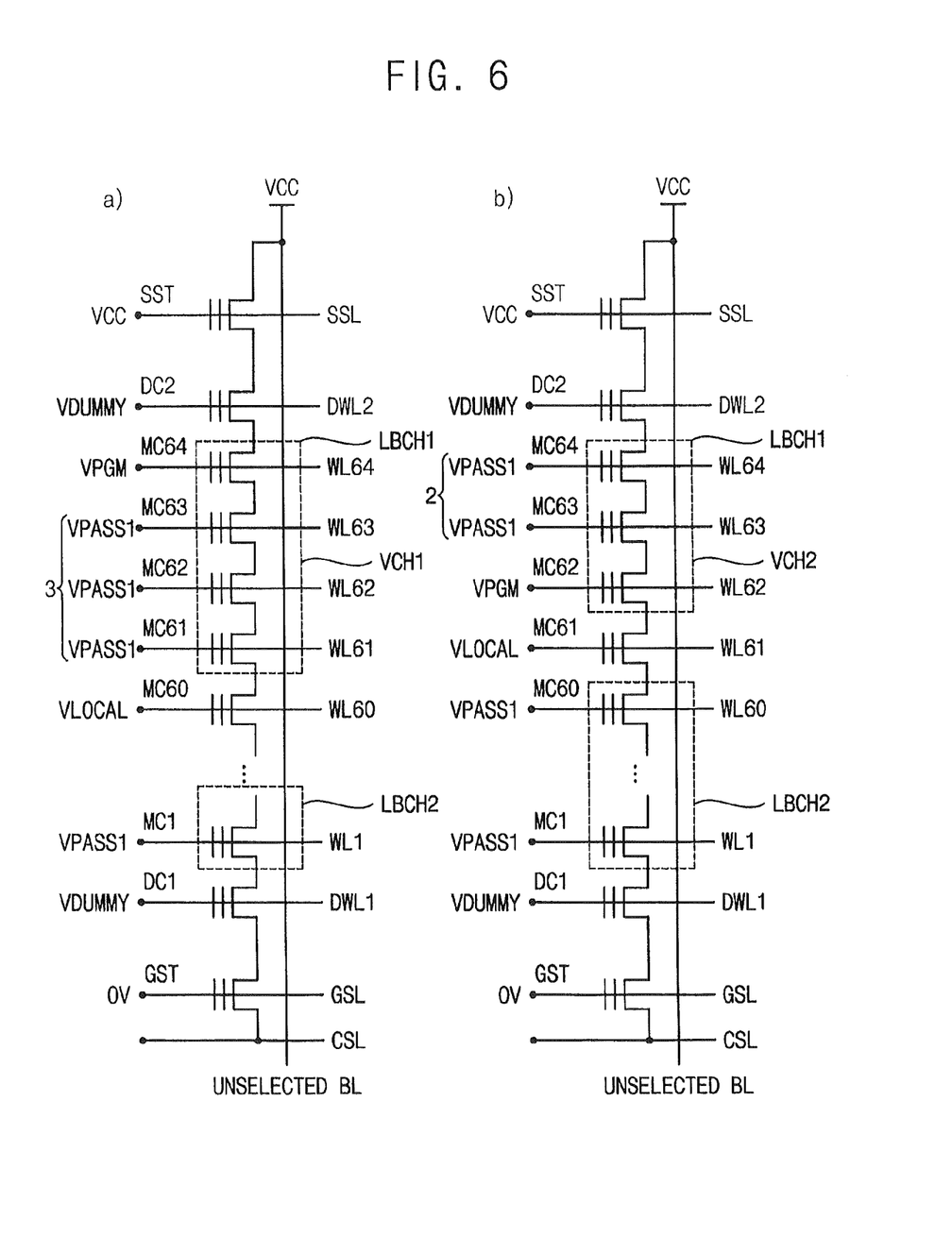
FIG. 6 illustrates a voltage application state according to the selection of a word line of a non-selected cell string according to a fourth example embodiment in which circuit a) illustrates a circuit diagram when the outermost word line is selected, and circuit b) illustrates a circuit diagram when an internal word line is selected. In this case, it is assumed that the local boosting scheme is applied.

FIG. 6 illustrates a voltage application state according to the selection of a word line of a non-selected cell string according to a fourth example embodiment in which circuit a) illustrates a circuit diagram when the outermost word line is selected, and circuit b) illustrates a circuit diagram when an internal word line is selected. In this case, it is assumed that the local boosting scheme is applied. Dotted regions of FIG. 6 represent local boost channels LBCH1 and LBCH2 according to the local boosting scheme.

As illustrated in circuit a) of FIG. 6, in the non-volatile memory device according to the example embodiment of the present inventive concept, when the outermost word line WL64 is selected, the local voltage VLOCAL is applied to the word line WL60 to form the local boost channel LBCH1 including the word lines WL64 to WL61 and the local boost channel LBCH2 including the word lines WL59 to WL1. The first pass voltage VPASS1 is applied to the three word lines WL61 to WL63 that are not selected.

As illustrated in circuit b) of FIG. 6, when the word line WL62 among the other word lines WL61 to WL63 is selected instead of the outermost word line WL64, the local voltage VLOCAL is applied to the word line WL61 to form the local boost channel LBCH1 including the word lines WL64 to WL62 and the local boost channel LBCH2 including the word lines WL60 to WL1. The first pass voltage VPASS1 is applied to the two word lines WL61 and WL63 that are not selected.

Therefore, when the outermost word line WL64 is selected, the program voltage VPGM is combined with three first pass voltages VPASS1 in parallel in the local boost channel LBCH1. However, when the internal word line WL62 is selected, the program voltage VPGM is combined with two first pass voltages VPASS1 in parallel in the local boost channel LBCH1. Accordingly, the number (=3) of the word lines WL1 to WL63, which are not selected, combined to the local boost channel LBCH1 when the outermost word line WL64 is selected is larger than the number (=2) of the word lines WL63, and WL64, which are not selected, combined to the local boost channel LBCH1 when the outermost word line WL62 is selected.

Accordingly, even if the same pass voltage VPASS1 is applied to the word lines that are not selected, because the first boost channel voltage VCH1 is formed lower than the second boost channel voltage VCH2, the occurrence of the hot carriers can be reduced. Therefore, the programming disturbance can be reduced or prevented in the memory cell MC64 that is inhibited from being programmed.

Embodiment 5

Figure 7:
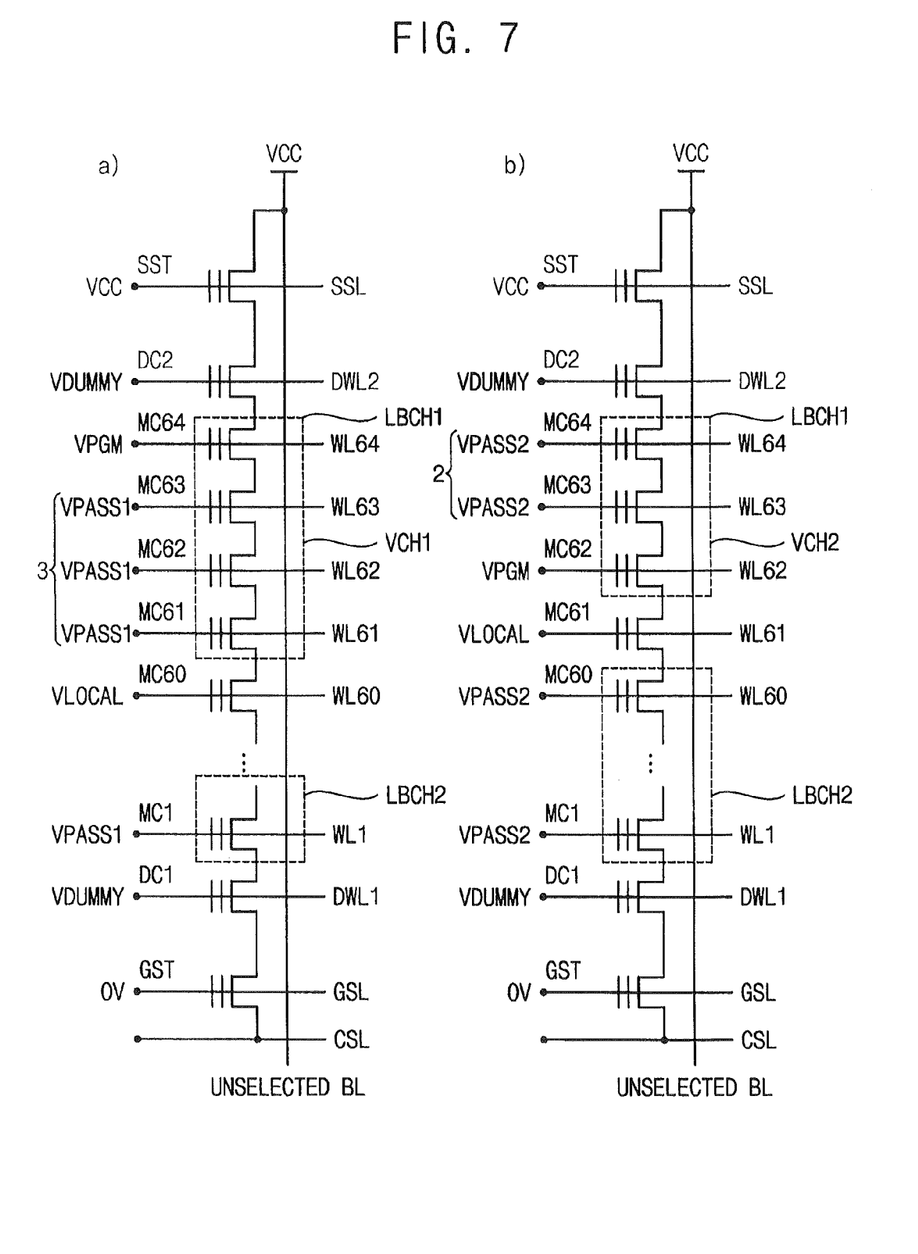
FIG. 7 illustrates a voltage application state according to the selection of a word line of a non-selected cell string according to a fifth example embodiment in which circuit a) illustrates a circuit diagram when the outermost word line is selected, and circuit b) illustrates a circuit diagram when an internal word line is selected.

FIG. 7 illustrates a voltage application state according to the selection of a word line of a non-selected cell string according to a fifth example embodiment in which circuit a) illustrates a circuit diagram when the outermost word line is selected, and circuit b) illustrates a circuit diagram when an internal word line is selected. In this case, it is assumed that the local boosting scheme is applied. Dotted regions of FIG. 7 represent local boost channels LBch1 and LBch2 according to the local boosting scheme.

When comparing with the fourth embodiment, the fifth embodiment makes a difference from the fourth embodiment in that the pass voltage applied to the word lines WL63 and WL64, which are not selected when the internal word line WL62 is selected, is the second pass voltage VPASS2 having a level higher than that of the first pass voltage VPASS1.

As described above, according to the present example embodiments, to reduce the level of the first boost channel voltage VCH1 when the outermost word line WL64 is selected to be lower than the level of the second boost channel voltage VCH2 when the internal word line is selected, the pass voltage applied to the word lines, which are not selected, and the number of the word lines, which are not selected, combined to the related boost channel are variously combined.

Meanwhile, as described above, the example embodiments according to the present inventive concept have been described by using the outermost memory cell MC64 connected with the string select transistor SST for illustrative purpose. This principle is applicable to the outermost memory cell MC1 connected with the ground select transistor GST.

The technology of preventing programming disturbance in the non-volatile memory device according to the example embodiments of the present inventive concept is applicable even if the NOP represents the accumulated hot carrier injection phenomenon.

In other words, although the programming disturbance caused by the hot carriers is not represented when the NOP is small, the programming disturbance may be caused by the accumulated hot carriers if the NOP is increased. Accordingly, according to the present example embodiments, if the NOP is counted, and the counted NOP is equal to or greater than the number A of frequencies in which the programming disturbance is caused by the accumulated hot carrier injection into the outermost memory cell, then the first boost voltage VCH1 may be reduced to be lower than the second channel voltage VCH2.

Figure 8:
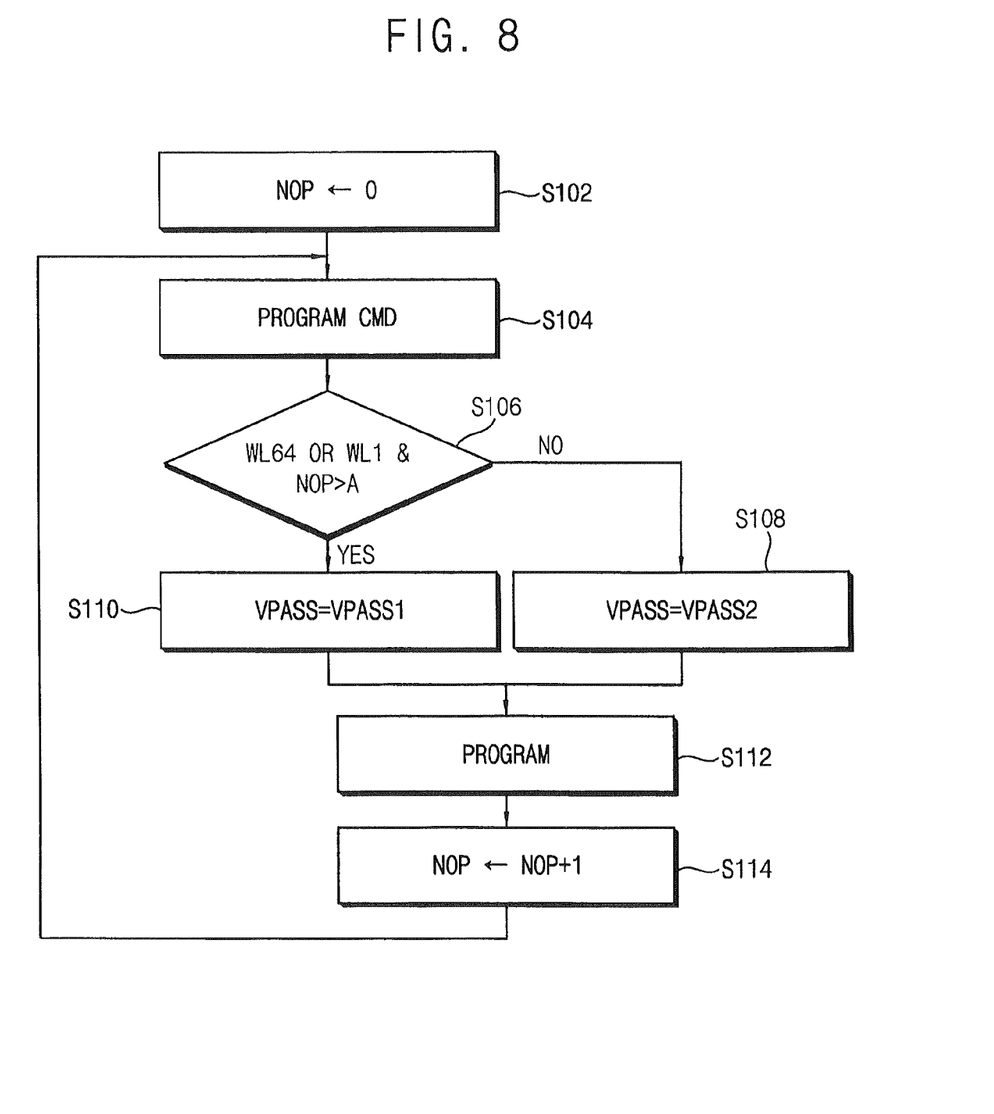
FIG. 8 is a flowchart that illustrates a program method when the outermost word line is selected based on the NOP according to embodiments of the inventive concept.

FIG. 8 is a flowchart that illustrates a program method when the outermost word line is selected based on the NOP according to the present embodiments.

In the control logic 160, an NOP count value is initialized to "0" in a system initialization (S102). Thereafter, when a program command is issued (S104), if a row address is a select address of the outermost word line WL1 or WL64, it is determined whether the NOP count value is greater than the critical number A causing the programming disturbance due to the accumulated hot carrier injection (S106).

If the NOP count value is less than the critical number A (S106), a control operation is performed so that the second pass voltage VPASS2 is a pass voltage applied to the word lines WL1 to WL63 which are not selected (S108). Next, the program voltage VPGM is applied to the outermost word line WL1 or WL64 to execute programming (S112). After the programming has been executed, the NOP count value is increased by 1 (S114), and operations return to await a next program command.

If the outermost word line is selected and the NOP count value is greater than the critical number A (S106), the control operation is performed so that the first pass voltage VPASS1 having a level lower than that of the second pass voltage VPASS2 becomes the pass voltage applied to the word lines WL1 to WL63 which are not selected (S110).

Meanwhile, as described above, the example embodiments according to the present inventive concept have been described by applying the NOP accumulation concept to the first and second embodiments in which a pass voltage is selected with respect to the same number of word lines. However, this is provided for the illustrative purpose, and the above principle is applicable to the case that the NOP accumulation concept is applied to the third and fifth example embodiments of controlling different numbers of non-selected word lines.

As described above, according to the example embodiment of the present inventive concept, a boost voltage when selecting the outermost word line of a non-volatile memory device is adjusted to be lower than a boost voltage when selecting the internal word line by applying different pass voltages to non-selected word lines or using different numbers of non-selected word lines coupled with the boost channel, according to the position of a selected word line in program operation. Therefore, in the non-volatile memory device according to the example embodiment of the present inventive concept, the programming disturbance can be reduced or prevented from being caused by hot carriers in the outermost word line.

Meanwhile, in FIGS. 2 to 8, although the present inventive concept has been described by using a 2D memory cell array circuit, the present inventive concept is not limited thereto. For example, the memory cell array 110 of FIG. 1 may include a 3D memory array cell, and the present inventive concept is applicable to the 3D memory cell array.

Figure 9:
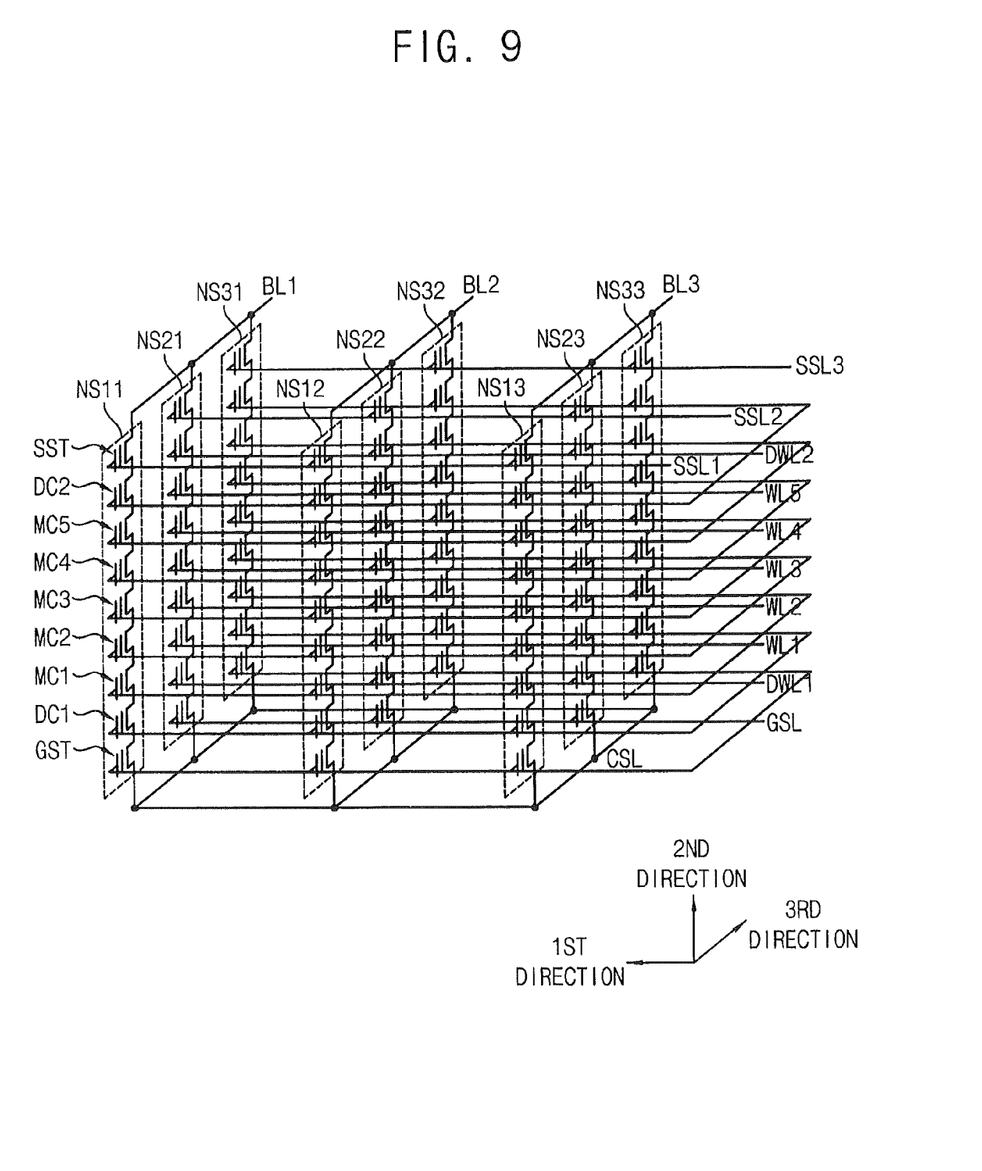
FIG. 9 is a circuit diagram illustrating the memory cell array 110 of FIG. 1 in more detail according to another example embodiment of the present inventive concept.

FIG. 9 is a circuit diagram illustrating the memory cell array 110 of FIG. 1 in more detail according to another example embodiment of the present inventive concept. In FIG. 9, it is assumed that the memory cell array 110 may be a 3D memory cell array differently from the case of FIG. 2.

Referring to FIG. 9, NAND strings NS11 to NS31 are electrically connected between a first bit line BL1 and a common source line CSL. Similarly, NAND strings NS12 to NS32 are electrically connected between a second bit line BL2 and the common source line CSL. NAND strings NS13 to NS33 are electrically connected between a third bit line BL3 and the common source line CSL. The first to third bit lines BL1 to BL3 extend in a third direction, and are arranged in parallel in the first direction.

Each NAND string (NS) includes a string select transistor (SST), memory cells (MCs), dummy memory cells (DMCs), and a ground select transistor (GST).

Gates of the memory cells located at the same layer are electrically connected with a word line extending in the first direction. In addition, gates of the dummy memory cells located at the same layer are electrically connected with a dummy word line extending in the first direction.

As described above, a non-volatile memory device according to the example embodiment of the present inventive concept includes a 3D memory cell array. In this case, in a non-volatile memory device, a boost select voltage when the outermost word line is selected is properly adjusted to be lower than a boost select voltage when the internal word line is selected in the program operation. Because the above operation is similar to the operation of the non-volatile memory device including the 2D memory cell array described with reference to FIGS. 2 to 8, the details thereof will be omitted. Accordingly, in the non-volatile memory device according to the example embodiment of the present inventive concept, the programming disturbance can be reduced or prevented from being caused by hot carriers.

Figure 10:
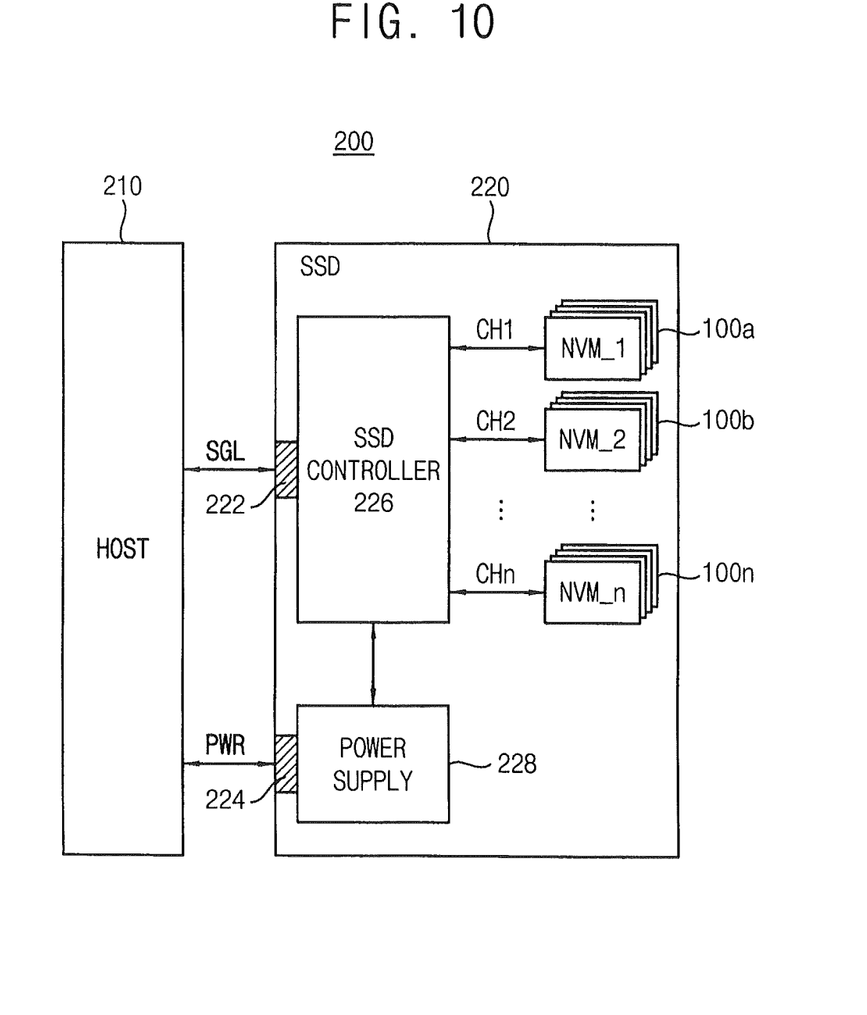
FIG. 10 is a block diagram illustrating a solid state drive (SSD) including the non-volatile memory device of FIG. 1.

FIG. 10 is a block diagram illustrating a solid state drive (SSD) including the non-volatile memory device of FIG. 1.

Referring to FIG. 10, an SSD system 200 includes a host 210 and an SSD 220. The SSD 220 transceivers a signal with the host through a signal connector 222, and receives power through a power connector 224. The SSD 220 includes a plurality of non-volatile memory devices 100a to 100n, an SSD controller 226, and an auxiliary power supply 228.

The non-volatile memory devices 100a to 100n are used as storage media of the SSD 220. The non-volatile memory devices 100a to 100n may be realized as a flash memory device having a high storage capacity. Although the SSD 220 mainly uses the flash memory, the SSD 220 may use non-volatile memory devices such as a PRAM, an MRAM, a ReRAM, and an FRAM in addition to the flash memory.

In FIG. 10, at least one of the non-volatile memory devices 100a to 100n may include the non-volatile memory device 100 illustrated in FIG. 1. In other words, according to the non-volatile memory device illustrated in FIG. 10, in the program operation, the boost channel voltage when the outermost word line is selected is properly adjusted to be lower than the boost channel voltage when the internal word line is selected, thereby reducing or preventing programming disturbance caused by hot carriers.

The non-volatile memory devices 100a to 100n may be connected with the SSD controller 226 through a plurality of channels CH1 to CHn. At least one memory device may be connected with one channel. The memory devices connected with one channel may be connected with the same data bus.

The SSD controller 226 transceives a signal SGL with the host 210 through the signal connector 222. In this case, the signal SGL may include a command, an address, and data. The SSD controller 226 writes data into a related memory device or reads data out of the related memory device according to the command of the host 210.

The auxiliary power supply 228 is connected with the host 210 through the power connector 224. The auxiliary power supply 228 may be supplied with power PWR from the host 210 and charged with the power PWR. Meanwhile, the auxiliary power supply 228 may be embedded in the SSD 220, or may be located outside the SSD 220. For example, the auxiliary power supply 228 may be located on a main board to supply auxiliary power to the SSD 220.

Figure 11:
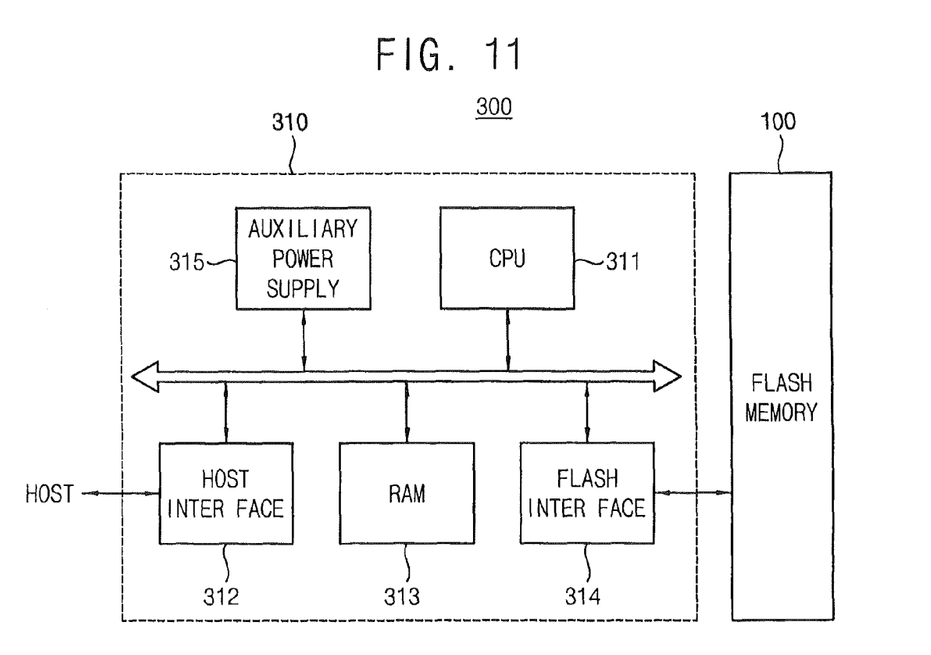
FIG. 11 is a block diagram illustrating a data storage device including a non-volatile memory device according to an example embodiment of the inventive concept.

FIG. 11 is a block diagram illustrating a data storage device including a non-volatile memory device according to an example embodiment.

Referring to FIG. 11, a data storage device 300 includes a memory controller 310 and a flash memory 100. The data storage device 300 includes all storage media, such as memory cards (e.g., SDs or MMCs) or portable storage devices (e.g., USB memories) that are detachable.

Referring to FIG. 11, the memory controller 310 includes a central processing unit (CPU) 311, a host interface 312, a random access memory (RAM) 313, a flash interface 314, and an auxiliary power supply 315. The auxiliary power supply 315 may be embedded in the memory controller 310 or located outside the memory controller 310.

The data storage device 300 is connected with a host for the use thereof. The data storage device 300 transceives data with the host through the host interface 312, and transceives data with the flash memory 100 through the flash interface 314. The data storage device 300 receives power from the host to perform an internal operation.

The flash memory device 100 illustrated in FIG. 11 may be the non-volatile memory device illustrated in FIG. 11. In other words, according to the non-volatile memory device illustrated in FIG. 11, in the program operation, the boost channel voltage when the outermost word line is selected is properly adjusted to be lower than the boost channel voltage when the internal word line is selected, thereby reducing or preventing programming disturbance caused by hot carriers.

Figure 12:
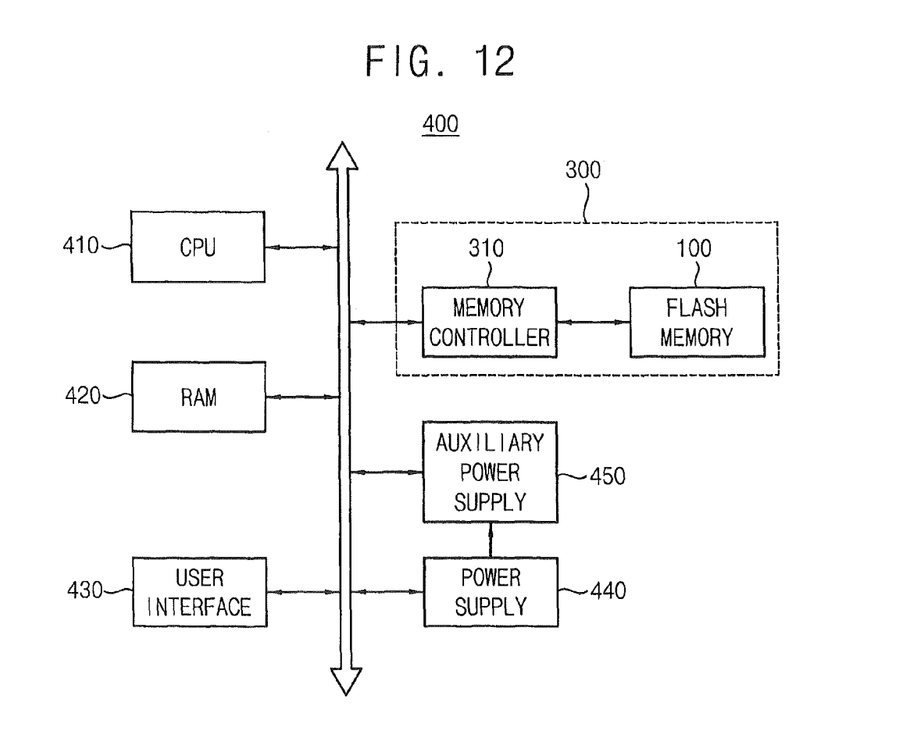
FIG. 12 is a block diagram illustrating an electronic device including the non-volatile memory device according to an example embodiment of the inventive concept.

FIG. 12 is a block diagram illustrating an electronic device including a non-volatile memory device according to an example embodiment. An electronic device 400 may be realized by using a personal computer (PC) or may be realized by using portal electronic devices, such as a notebook computer, a cellular phone, a PDA (personal digital assistant), and a camera.

Referring to FIG. 12, the electronic device 400 includes a semiconductor memory device 300, a central processing unit 410, a RAM 420, a user interface 430, a power supply 440, and an auxiliary power supply 450. The semiconductor memory device 300 includes a flash memory 100 and a memory controller 310.

A flash memory 100 illustrated in FIG. 12 may be the non-volatile memory device of FIG. 1. In other words, according to the non-volatile memory device illustrated in FIG. 12, in the program operation, the boost channel voltage when the outermost word line is selected is properly adjusted to be lower than the boost channel voltage when the internal word line is selected, thereby reducing or preventing programming disturbance caused by hot carriers.

Meanwhile, the foregoing is illustrative of example embodiments and is not to be construed as limiting thereof. For example, in the foregoing, it is assumed that one dummy memory cell is connected with each of a ground select transistor and a string select transistor. However, this is provided for the illustrative purpose, and at least dummy memory cells may be connected with each of the ground select transistor and the string select transistor in series.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A non-volatile memory device, comprising:
    a memory cell array having a plurality of cell strings in which a plurality of memory cells are connected with each other in series between a string select transistor and a ground select transistor; and
    a voltage generator to generate a program voltage, a first pass voltage, and a second pass voltage,
    wherein when programming one of the outermost memory cells of the plurality of memory cells a first boost channel voltage is generated based on the first pass voltage applied to word lines of ones of the memory cells other than the one of the outermost memory cells and when programming one of the memory cells of the plurality of memory cells other than the outermost memory cells of the plurality of memory cells a second boost channel voltage is generated based on the second pass voltage applied to word lines of ones of the memory cells other than the one of the memory cells of the plurality of memory cells being programmed;
    wherein a level of the first boost channel voltage is lower than a level of the second boost channel voltage; and
    wherein a level of the first pass voltage is lower than a level of the second pass voltage.

2. The non-volatile memory device of claim 1, wherein the first boost channel voltage is formed by combining the program voltage applied to a word line of the one of the outermost memory cells with the first pass voltage applied to the word lines of the ones of the memory cells other than the one of the outermost memory cells,
    the second boost channel voltage is formed by combining the program voltage applied to a word line of the one of the memory cells of the plurality of memory cells other than the outermost memory cells of the plurality of memory cells and the second pass voltage applied to the word lines of the ones of the memory cells other than the one of the memory cells of the plurality of memory cells.

3. The non-volatile memory device of claim 1, wherein ones of the plurality of cell strings that are non-selected for programming are driven according to a self-boost scheme, or a local boost scheme.

4. The non-volatile memory device of claim 1, wherein the first boost channel voltage is formed through a self-boost scheme and the second boost channel voltage is formed through a local boost scheme.

5. The non-volatile memory device of claim 1, wherein a number of the word lines combined to form a first boost channel, which forms the first boost channel voltage, to receive the first pass voltage is larger than a number of the word lines combined to a form second boost channel, which forms the second boost channel voltage, to receive the second pass voltage.

6. The non-volatile memory device of claim 1, wherein a condition to set the first boost channel voltage lower than the second boost channel voltage is that a number of programs is equal to or greater than a critical number causing programming disturb due to accumulated hot carrier injection into the one of the outermost memory cells.

7. The non-volatile memory device of claim 1, wherein a first dummy memory cell is interposed between the ground select transistor and the memory cells, and a second dummy memory cell is interposed between the string select transistor and the memory cells.

8. A method of programming a non-volatile memory device including a memory cell array having a plurality of cell strings in which a plurality of memory cells are connected with each other in series between a string select transistor and a ground select transistor, and a voltage generator to generate a program voltage, a first pass voltage, and a second pass voltage, the method comprising:

generating a first boost channel voltage responsive to programming one of the outermost memory cells of the plurality of memory cells, the first boost channel voltage being generated based on the first pass voltage applied to word lines of ones of the memory cells other than the one of the outermost memory cells; and generating a second boost channel voltage responsive to programming one of the memory cells of the plurality of memory cells other than the outermost memory cells of the plurality of memory cells, the second boost channel voltage being generated based on the second pass voltage applied to word lines of ones of the memory cells other than the one of the memory cells of the plurality of memory cells being programmed;

wherein a level of the first boost channel voltage is lower than a level of the second boost channel voltage; and wherein a level of the first pass voltage is lower than a level of the second pass voltage.

9. The method of claim 8, wherein the first boost channel voltage is formed by combining the program voltage applied to a word line of the one of the outermost memory cells with the first pass voltage applied to the word lines of the ones of the memory cells other than the one of the outermost memory cells, the second boost channel voltage is formed by combining the program voltage applied to a word line of the one of the memory cells of the plurality of memory cells other than the outermost memory cells of the plurality of memory cells and the second pass voltage applied to the word lines of the ones of the memory cells other than the one of the memory cells of the plurality of memory cells.

10. The method of claim 8, wherein ones of the plurality of cell strings that are non-selected for programming are driven according to a self-boost scheme, or a local boost scheme.

11. The method of claim 8, wherein the first boost channel voltage is formed through a self-boost scheme, and the second boost channel voltage is formed through a local boost scheme.

12. The method of claim 8, wherein a number of the word lines combined to form a first boost channel, which forms the first boost channel voltage, to receive the first pass voltage is larger than a number of the word lines combined to a form second boost channel, which forms the second boost channel voltage, to receive the second pass voltage.

13. The method of claim 12, wherein a level of the first pass voltage is lower than a level of the second pass voltage.

14. The method of claim 8, wherein a condition to set the first boost channel voltage lower than the second boost channel voltage is that a number of programs is equal to or greater than a critical number causing programming disturb due to accumulated hot carrier injection into the one of the outermost memory cells.

15. A non-volatile memory device, comprising:

a memory cell array having a plurality of cell strings in which a plurality of memory cells are connected with each other in series; and a voltage generator to generate a program voltage, a first pass voltage, and a second pass voltage, to generate a first boost channel voltage responsive to programming one of the outermost memory cells of the plurality of memory cells, the first boost channel voltage being generated based on the first pass voltage applied to word lines of ones of the memory cells other than the one of the outermost memory cells, and to generate a second boost channel voltage responsive to programming one of the memory cells of the plurality of memory cells other than the outermost memory cells of the plurality of memory cells, the second boost channel voltage being generated based on the second pass voltage applied to word lines of ones of the memory cells other than the one of the memory cells of the plurality of memory cells being programmed;

wherein a level of the first boost channel voltage is lower than a level of the second boost channel voltage;

wherein a level of the first pass voltage is lower than a level of the second pass voltage; and wherein ones of the plurality of cell strings that are non-selected for programming are driven according to a self-boost scheme or a local boost scheme.

16. The non-volatile memory device of claim 15, wherein the first boost channel voltage is formed by combining the program voltage applied to a word line of the one of the outermost memory cells of the plurality of memory cells with the first pass voltages applied to the word lines of the ones of the memory cells other than the one of the outermost memory cells;

wherein the second boost channel voltage is formed by combining the program voltage applied to a word line of the one of the memory cells of the plurality of memory cells other than the outermost memory cells and the second pass voltage applied to the word lines of ones of the memory cells other than the one of the memory cells of the plurality of memory cells being programmed.

17. The non-volatile memory device of claim 15, wherein the first boost channel voltage is formed through a self-boost scheme and the second boost channel voltage is formed through a local boost scheme.

18. The non-volatile memory device of claim 15, wherein a number of the word lines combined to form a first boost channel is greater than a number of the word lines combined to form a second boost channel.

* * * * *